United States Patent
Reif et al.

(10) Patent No.: US 7,307,003 B2
(45) Date of Patent: Dec. 11, 2007

(54) METHOD OF FORMING A MULTI-LAYER SEMICONDUCTOR STRUCTURE INCORPORATING A PROCESSING HANDLE MEMBER

(75) Inventors: Rafael Reif, Newton, MA (US); Kuan-Neng Chen, Cambridge, MA (US); Chuan Seng Tan, Cambridge, MA (US); Andy Fan, Cambridge, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 15 days.

(21) Appl. No.: 10/749,103

(22) Filed: Dec. 30, 2003

(65) Prior Publication Data

US 2004/0219765 A1    Nov. 4, 2004

Related U.S. Application Data

(60) Provisional application No. 60/437,549, filed on Dec. 31, 2002.

(51) Int. Cl.
- *H01L 21/30* (2006.01)
- *H01L 21/46* (2006.01)
- *H01L 23/34* (2006.01)

(52) U.S. Cl. .................. 438/455; 257/723; 257/701; 257/E25.006; 257/E21.499

(58) Field of Classification Search .............. 438/455; 257/723

See application file for complete search history.

(56) References Cited

U.S. PATENT DOCUMENTS

| 4,313,126 A | 1/1982 | Krumm et al. |
| 4,402,761 A | 9/1983 | Feist |
| 4,456,888 A | 6/1984 | Ayasli |

(Continued)

FOREIGN PATENT DOCUMENTS

DE    100 47 963 A 1    3/2001

(Continued)

OTHER PUBLICATIONS

PCT/US 03/41559 PCT International Search Report Dated Apr. 27, 2005.

(Continued)

*Primary Examiner*—David A. Zarneke
(74) *Attorney, Agent, or Firm*—Daly, Crowley, Mofford & Durkee, LLP

(57) ABSTRACT

A method of forming a multi-layer semiconductor structure includes attaching a handle-member to a top surface of a first structure using a first interface. At least one region of a bottom surface of the first structure is etched to form at least a first via-hole for exposing a portion of a first conductive member defined on the first structure. A conductive material is disposed in the first via-hole such that a first end of the conductive material is in electrical communication with the first conductive member and a second end of the conductive material is exposed at the bottom surface of the first structure. A second interface is disposed over at least the second end of the conductive material, which serves as a bonding and/or electrical interface between the first conductive member defined on the first structure and a second structure of the multi-layer semiconductor device structure.

45 Claims, 9 Drawing Sheets

U.S. PATENT DOCUMENTS

| | | | |
|---|---|---|---|
| 4,599,704 A | 7/1986 | Mazin | |
| 4,939,568 A | 7/1990 | Kato et al. | |
| 4,986,861 A | 1/1991 | Nishida et al. | |
| 5,156,997 A | 10/1992 | Kumar et al. | |
| 5,206,186 A | 4/1993 | Neugebauer et al. | |
| 5,236,118 A | 8/1993 | Bower et al. | |
| 5,270,261 A | 12/1993 | Bertin et al. | |
| 5,370,301 A | 12/1994 | Belcher et al. | |
| 5,391,257 A | 2/1995 | Sullivan et al. | |
| 5,445,994 A | 8/1995 | Gilton | |
| 5,504,376 A | 4/1996 | Sugahara et al. | |
| 5,523,628 A | 6/1996 | Williams et al. | |
| 5,563,084 A | 10/1996 | Ramm et al. | |
| 5,669,545 A | 9/1997 | Pham et al. | |
| 5,706,578 A | 1/1998 | Hubner | |
| 5,767,009 A | 6/1998 | Yoshida et al. | |
| 5,821,138 A | 10/1998 | Yamazaki et al. | |
| 5,825,080 A | 10/1998 | Imaoka et al. | |
| 5,877,034 A * | 3/1999 | Ramm et al. | 438/15 |
| 5,902,118 A | 5/1999 | Hubner | |
| 5,904,562 A | 5/1999 | Nulman | |
| 5,923,087 A | 7/1999 | Suzuki et al. | |
| 5,940,683 A | 8/1999 | Holm et al. | |
| 5,985,693 A | 11/1999 | Leedy | |
| 5,986,593 A * | 11/1999 | Kawahara et al. | 341/94 |
| 5,998,291 A * | 12/1999 | Bakhit et al. | 438/618 |
| 5,998,808 A | 12/1999 | Matsushita | |
| 6,027,958 A | 2/2000 | Vu et al. | |
| 6,346,459 B1 * | 2/2002 | Usenko et al. | 438/458 |
| 6,372,608 B1 * | 4/2002 | Shimoda et al. | 438/455 |
| 6,441,478 B2 | 8/2002 | Park | |
| 6,465,892 B1 | 10/2002 | Suga | |
| 6,500,694 B1 * | 12/2002 | Enquist | 438/109 |
| 6,506,664 B1 * | 1/2003 | Beyne et al. | 438/455 |
| 6,525,415 B2 * | 2/2003 | Koyanagi et al. | 257/686 |
| 6,548,391 B1 * | 4/2003 | Ramm et al. | 438/611 |
| 6,593,213 B2 * | 7/2003 | Stanbery | 438/478 |
| 6,600,173 B2 | 7/2003 | Tiwari | |
| 6,717,244 B1 | 4/2004 | Hikita et al. | |
| 6,881,647 B2 * | 4/2005 | Stanbery | 438/455 |
| 6,984,571 B1 * | 1/2006 | Enquist | 438/459 |
| 7,037,755 B2 * | 5/2006 | Enquist | 438/109 |
| 7,126,212 B2 * | 10/2006 | Enquist et al. | 257/684 |
| 2002/0050635 A1 | 5/2002 | Ogura et al. | |
| 2002/0074670 A1 | 6/2002 | Suga | |
| 2002/0109236 A1 | 8/2002 | Kim et al. | |
| 2002/0135062 A1 | 9/2002 | Mastromatteo et al. | |
| 2002/0135075 A1 | 9/2002 | Leedy | |
| 2004/0124538 A1 | 7/2004 | Reif et al. | |
| 2004/0126994 A1 | 7/2004 | Reif et al. | |
| 2004/0219765 A1 | 11/2004 | Reif et al. | |
| 2005/0048736 A1 * | 3/2005 | Kerdiles et al. | 438/455 |
| 2007/0096263 A1 * | 5/2007 | Furukawa et al. | 257/621 |
| 2007/0128827 A1 * | 6/2007 | Faris | 438/455 |

FOREIGN PATENT DOCUMENTS

| | | |
|---|---|---|
| EP | 1 041 624 A1 | 10/2000 |
| EP | 1 151 962 A1 | 7/2001 |
| EP | 1 432 032 A2 | 6/2004 |
| FR | 2 645 681 | 4/1989 |
| WO | WO 02/09182 A1 | 1/2002 |

OTHER PUBLICATIONS

PCT/US 03/41559 International Search Report dated Mar. 11, 2005.
PCT/US 03/41557 International Search Report dated Mar. 16, 2005.
PCT/US 03/41407 International Search Report, Sep. 15, 2004.
Y. Hayashi, Fabrication of Three Dimensional IC Using "Cumulatively Bonded IC" (CUBIC) Technology Symposium on VLSI Technology, 1990, pp. 95-96.
PCT/US/03/41514 International Search Report Jun. 17, 2004.
Chris Gaither, Intel Set To Unveil Advanced Communications Chip, The Boston Globe. Oct. 15, 2002, pp. 1-3, Boston, Massachusetts.
Peter Clarke. IEDM Late Paper: IBM Shows How to Stack for 3D Circuitry, Silicon Strategies.Com, Nov. 28, 2002, pp. 1-2, LONDON.
Tru-Si Technologies, Through-Silicon Vias, Tru-Si Technologies Home Page, Apr. 7, 2003, p. 1, Sunnyvale. California.
Mark Lapedus, Tezzaron Devises Multi-Wafer Stack for 3-D Chips, Semiconductors EE Times, Jun. 30, 2003, pp. 1-3, Naperville, Illinois.

* cited by examiner

METHOD OF FORMING A MULTI-LAYER SEMICONDUCTOR STRUCTURE INCORPORATING A PROCESSING HANDLE MEMBER

CROSS REFERENCE TO RELATED APPLICATION

This application claims the benefit under 35 U.S.C. §119(e) of U.S. Provisional Application No. 60/437,549, filed on Dec. 31, 2002, entitled, Multi-Layer Integrated Semiconductor Structure, which is hereby incorporated by reference in its entirety.

STATEMENT REGARDING FEDERALLY SPONSORED RESEARCH

This invention was made with government support under a subcontract between Georgia Institute of Technology and M.I.T., under Prime Grant Number MDA972-99-1-0002, awarded by the Defense Advanced Research Projects Agency. The government has certain rights in the invention.

FIELD OF THE INVENTION

The present invention relates generally to a method of forming a multi-layer semiconductor structure and, more specifically, to a method of forming a multi-layer semiconductor structure including the use of a removable processing handle member to protect portions of the multi-layer semiconductor structure from damage during execution of the method.

BACKGROUND

A number of individual integrated circuit structures can be stacked and bonded together to form a multi-layer semiconductor structure, which is commonly referred to as a three-dimensional integrated circuit. The one key process in creating multi-layered structures is "layer transfer," i.e., physically removing a thin layer of semiconductor material from its original supporting substrate and attaching the film to a dedicated anchor substrate (or more simply an "anchor"). When device layers from multiple, distinct substrates are all individually transferred onto a single dedicated anchor, a multi-layered three-dimensional structure is formed. However, due to the relatively small size and fragility of semiconductor substrates (e.g. thin films), a direct manipulation and transfer of each layer will likely cause physical damage to one or more of the substrates or devices on one or more of the substrates which form the multi-layered three-dimensional structure.

This problem is further exacerbated in that most integrated circuit processing operations include automated processing lines that can be difficult to control and/or adjust to accommodate varying degrees of size and fragility of the integrated circuit structures.

SUMMARY OF THE INVENTION

It has, therefore, been recognized that it would be desirable to provide a removable processing handle member that can be disposed on (e.g. attached or otherwise coupled to) a semiconductor structure to protect the semiconductor structure from damage during execution of a method of forming a multi-layer semiconductor structure. Significantly, the thin layer to be transferred is in contact with a substrate at all processing steps, whether it is the original, the handle, or the dedicated anchor.

In accordance with the present invention, a method of forming a multi-layer semiconductor structure includes two phases: an "original-to-handle" layer transfer and a "handle-to-anchor" layer transfer. Specifically, an "original" semiconductor substrate contains the semiconductor (e.g. a thin semiconductor film) to be transferred, a handle substrate (or "handle member" or more simply "handle") is a temporary support, and the anchor is the dedicated substrate in which all film transfers end on. As starting material, the handle substrate is comprised of a laminate structure on its front surface (denoted here by the "face" of a substrate). A similar laminate structure is also required on the face of the original semiconductor. Next, to initiate the original-to-handle layer transfer, the original semiconductor substrate and the handle substrate are aligned and "face-to-face" attached to each other using heated fusion of the two laminate structures in contact. The original-to-handle layer transfer will be complete upon removal of at least a portion of the original substrate from its backside by mechanical grinding and chemical etching. The resulting structure is a handle-semiconductor complex (in this particular case a handle-thin film complex), where the face of the semiconductor (e.g. the thin film) is in contact with the face of the handle.

Next, to initiate the handle-to-anchor layer transfer, the backside of the thin film complex is attached to the face of the anchor substrate (e.g. by using a bond material). To complete this layer transfer step, the handle substrate is removed. Removal may be accomplished using a variety of techniques. Removal may be accomplished, for example, by placing the entire handle-thin film-anchor complex into an aqueous or vapor phase solution, wherein at least one layer of the laminate structure is provided having a reaction rate to the solution which is greater than the reaction rate of the bond material such that the laminate structure can be removed without releasing the bond material. Thus, the handle is removed while the thin film remains attached to the anchor. It should be appreciated that while reference is made herein to a thin film substrate, the technique may be applied to any semiconductor substrate.

With this particular arrangement, a technique for forming a multi-layer semiconductor structure is provided. By providing a structure which includes a handle, it is possible to transport intermediate semiconductor sections without damaging semiconductor circuitry. By using the handle, multiple semiconductor structures can be stacked and bonded together to provide multi-layer semiconductor structures. By providing the handle so that it can be released from so-fabricated multi-layer semiconductor structures, a multi-layer semiconductor structure suitable for use in devices and circuits is provided.

In accordance with one aspect of the present invention, the laminate structure that fuses during the original-handle layer transfer juncture comprises of three layers of materials. When the laminate structure is immersed in a predetermined aqueous (or vapor) solution, at least one of the first, second and third layers include a material having a dissolution reaction rate which is greater than the reaction rate of a predetermined bonding material disposed in the handle-anchor transfer phase of the process.

With this particular arrangement, a laminate handle member adapted for releasable coupling to a semiconductor structure is provided. By providing a handle from at least one material having a reaction rate to a predetermined solution which is greater than the reaction rate of a bond material holding the handle-thin film complex to the anchor semiconductor substrate, a handle can be used to carry or otherwise transport one or more semiconductor structures coupled thereto and then the handle can be released without damaging or degrading bonds within and between the semiconductor structures.

BRIEF DESCRIPTION OF THE DRAWING

The foregoing and other objects of this invention, the various features thereof, as well as the invention itself, can be more fully understood from the following description, when read together with the accompanying drawings in which:

as shown in FIG. 1A;

DETAILED DESCRIPTION OF THE INVENTION

In accordance with an embodiment of the present invention, set forth is a removable processing handle member that can be disposed on a semiconductor structure to transport the semiconductor structure, and which can protect the semiconductor structure from damage during execution of a method for forming a multi-layer semiconductor structure. One such exemplary multi-layer semiconductor structure 5 is shown in FIG. 4A, and one exemplary fabrication method is described in detail below in connection with FIGS. 1A, 1B, 2A, 2B, 2C, 2D, 3A, 3B, 4A and 4B. It should be appreciated that, unless otherwise noted, like elements are provided having like reference designations throughout the several views.

Figure 1A:
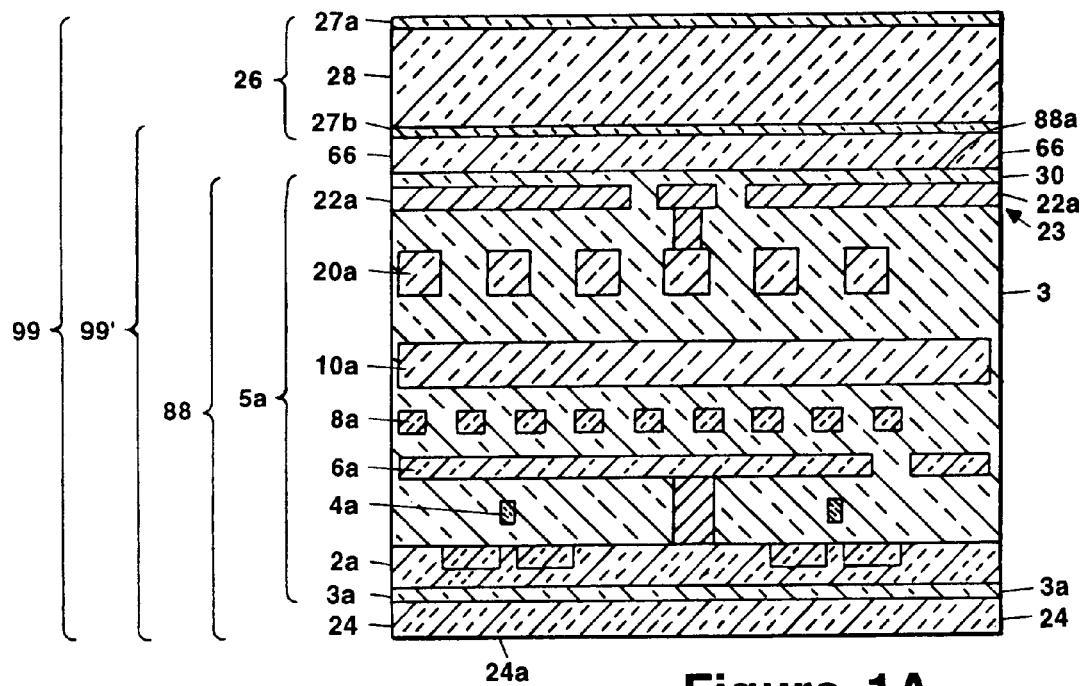
FIG. 1A shows a removable processing handle member bonded onto the original semiconductor substrate containing the thin layer to be transferred.

Referring now to FIG. 1A, an original-handle complex 99 is shown provided from an original semiconductor substrate 88 (e.g. an original wafer or die) having disposed thereover a laminate structure 66 (with the combination of the substrate 88 and laminate 66 providing a semiconductor substrate 99') and a handle member 26. As will become apparent from the description provided herein below, the handle member 26 makes it possible to transport semiconductor structures without damaging semiconductor circuitry which may be contained therein. As will also become apparent from the description hereinbelow, by using the handle 26, multiple semiconductor structures can be stacked to provide multi-layer semiconductor structures.

In the exemplary embodiment shown in FIG. 1A, handle member 26 is provided from a substrate 28 having film layers 27a, 27b disposed on first and second opposing surfaces thereof. The substrate 28 may, for example, be provided from a semiconductor material, an insulator material or even a conductor material. For example, substrate 28 may be provided from silicon, glass or any other substrate material. In one embodiment, the handle substrate 28 is provided having a thickness typically in the range of about 600 microns.

The film layers 27a, 27b protect the handle member 26 from chemicals or other agents to which the handle member 26 may be exposed during attachment to and removal of the handle member 26 to/from the laminate structure 66. In one embodiment, the processing handle member 26 includes a relatively thin layer of low-pressure chemical vapor deposition (LPCVD) silicon nitride or silicon dioxide 27a, a bulk silicon handle substrate 28; and another relatively thin layer of silicon nitride or silicon dioxide 27b. The layers 27a, 27b provide the handle member (26) having chemical protection against at least one of: acids, bases, and caustic vapors. In the exemplary embodiment shown in FIG. 1A, the film layers 27a, 27b may be provided from silicon nitride having a thickness in the range of about 10-200 nanometers (nm) with a range of about 100-150 nm being preferred or from silicon dioxide having a thickness in the range of about 50 nm-750 nm with a range of about 500 nm-550 nm being preferred.

In one embodiment, to be described in detail below in conjunction with FIG. 1B, the laminate structure 66 is provided as a fused double-laminate structure 66 with each of the laminate structures 66a, 66b (FIG. 1B) provided from three or more layers. In other embodiments, however, the laminate structure 66 may be provided as a single layer structure or as a double layer structure.

In the embodiment shown in FIG. 1A the laminate structure 66 is disposed over a first surface 88a the original semiconductor substrate 88 to provide the semiconductor substrate 99'. The original semiconductor substrate 88 includes a substrate 24 (which may be provided, for example, as a bulk silicon substrate) having a thin film semiconductor structure 5a disposed over a first surface thereof. Thus, in this embodiment, the original-handle complex 99 is a first semiconductor-handle complex having a substrate portion.

In other embodiments, however, the original semiconductor substrate 88 may simply be provided from the thin film semiconductor structure itself (i.e. without the substrate). That is, the original semiconductor substrate 88 may be provided from a plurality of thin film semiconductor structures comprised of a plurality of thin film semiconductor layers. It should thus be appreciated that the process to begin fabrication of a three-dimensional semiconductor circuit can begin by providing an original semiconductor substrate, which includes a thin film semiconductor structure having one or more layers of transistors. Alternatively, if the thin film technology being used produces a thin film, which is sufficiently thick (e.g. 20 microns or thicker due to relatively large amounts of inter-level dielectrics and interconnects used, rather than substrate thickness), then the process can begin by providing a thin film semiconductor structure without any substrate support. Alternatively still, the thin film 5a itself may be comprised of a sandwich of many thin layers of individual semiconductor substrates.

In the embodiment shown in FIG. 1A, the thin film portion 5a is provided from a dielectric layer 3a having at least one semiconductor device layer 2a disposed thereover. The layer 3a may, for example be provided from silicon oxide or another suitable dielectric. It should be appreciated that in some embodiments, layer 3a may be omitted in which case the thickness of one of (or both of) layers 2a and layer 24 may be increased to account for the thickness of the omitted layer 3a. The semiconductor device layer 2a can include a number of metal-oxide-silicon (MOS) devices, complementary-MOS (CMOS) devices, or a number of other active or passive integrated circuit semiconductor devices. The semiconductor device layer may comprise silicon or any other semiconductor material.

The thin film portion 5a of the original semiconductor substrate 88 further includes a number of metal layers or conductive interconnect structures 4a, 6a, 8a, 10a and 20a (hereinafter collectively referred to as "interconnect structures 20") that are insulated from each other by a number of layers of dielectric material, which are collectively referred to as "dielectric material 3." Dielectric material 3 can comprise one or more inorganic and organic dielectric materials. A number of conductive paths (e.g. conductor filled via-holes) are incorporated into the original-handle complex 99 to vertically couple two or more of the interconnect structures 20 and/or to vertically couple one or more portions of the semiconductor device layer 2a to one or more of the interconnect structures 20.

An interface portion 22a is disposed just under the planarized oxide layer 30 of the-original semiconductor substrate 88. As will become apparent from the descriptions provided below in conjunction with FIGS. 3A-4B, the interface portion 22a provides an interface to other semiconductor device structures (not shown in FIG. 1A) which may be stacked on top of each other to provide a final multi-layer semiconductor device structure. One example of such a multi-layer semiconductor device structure will be described in detail below in conjunction with FIG. 4A. The interface portion 22a may be disposed over the original semiconductor substrate 88 using any technique well known to those of ordinary skill in the art. The interface portion 22a is provided in a pattern or shape, which promotes scalability of the multi-layer semiconductor device structure 5 (FIG. 4A).

In one embodiment, the interface portion 22a can include a bilayer of Cu/Ta having a thickness ranging from approximately 50 nm to approximately 300 nm. The interface portion 22a is passivated by an overlayer of Plasma-Enhanced Chemical Vapor Deposition (PECVD) oxide having a thickness of approximately 5 µm, followed by an oxide chemical-mechanical-polishing (CMP) for providing the PECVD oxide layer 30 on top of interface portion 22a with a substantially planar top surface. The laminate structure 66 is disposed over the planarized PECVD oxide 30, which enables the original-handle layer transfer process.

It should be appreciated that the handle member 26 may be provided having a laminate structure (or a portion of a laminate structure) as part thereof. Alternatively, in some embodiments it may be desirable to provide, a stable laminate having an adhesive characteristic such that the laminate can be disposed directly on the original semiconductor substrate 88 while there is no laminate on the handle substrate. In such an embodiment, it may also be desirable to provide the top layer of the laminate such that it attaches (e.g. sticks or otherwise adheres) to the handle substrate.

Figure 1B:
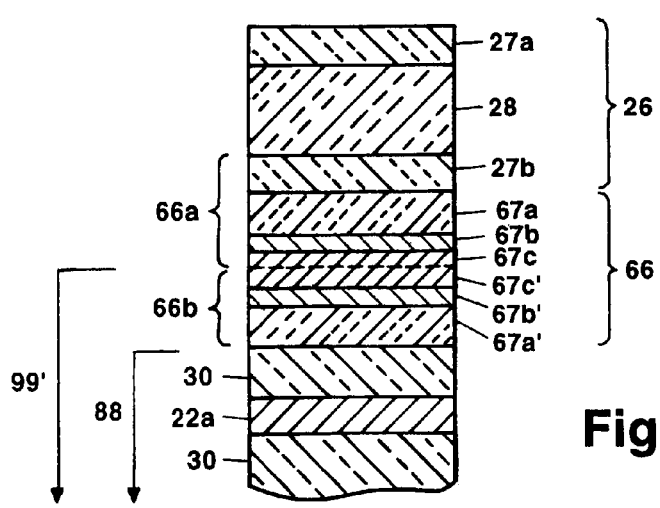
FIG. 1B shows an enlarged view of the removable processing handle member, bonded onto the original semiconductor substrate containing the thin layer to be transferred.

Referring now to FIG. 1B, in which like elements of FIG. 1A are provided having like reference designations, the laminate layer 66 is shown provided as a fused double-laminate structure 66. In the exemplary embodiment of FIG. 1B in which the laminate layer 66 is provided as a fused double-laminate structure 66, the laminate structure 66 includes a handle-member-laminate structure 66a and an original-semiconductor-laminate structure 66b. The handle-member-laminate structure 66a is here provided from a first layer 67a, a second layer 67b and a third layer 67c. Similarly, original-semiconductor laminate structure 66b includes first, second and third layers 67a', 67b', and 67c', respectively. The use of three layers in each of the laminate structures 66a, 66b is based, at least in part, upon the fact that the third layers 67c, 67c' are provided from copper.

In one embodiment, the first layer 67a may be provided from Zirconium (Zr) or aluminum (Al), the second layer 67b may be provided from tantalum (Ta) and the third layer 67c may be provided from copper (Cu). The Zr layer can have a thickness ranging from approximately 100 nm to about 20 microns (µm) with a range of about 400 nm-600 nm being preferred and a thickness of about 500 nm being practical. Similarly, the Cu layer can have a thickness ranging from approximately 100 nm to 1 µm) with a range of about 250 nm to 350 nm being preferred and a thickness of about 300 nm being practical. The Ta layer can have a thickness ranging from approximately 10 nm-700 nm with a range of about 50-150 being preferred and a range of about 50 nm to 100 nm being most preferred and a thickness of about 100 being practical.

In an alternate embodiment, the first layer 67a may be provided from tantalum (Ta), the second layer 67b may be provided from as Zirconium (Zr) or aluminum (Al) and the third layer 67c may be provided from copper (Cu). Thus, the materials utilized in at least the first and second layers of a three layer laminate system as shown in FIG. 1B are not unique. Rather, materials having appropriate characteristics may be used. It should be appreciated that while this approach (i.e. layer 67a provided from Tantalum (Ta) and layer 67b provided from as Zirconium (Zr) or Aluminum (Al)) will still function as intended (i.e. fusing layers 67c, 67c' will still combine or fuse into an integral layer when placed in contact and subject to appropriate fusing stimulus), the second layer 2 will dissolve with slightly more effort since the Cu will alloy slightly with Zr and Al under heat.

It should also be appreciated that the laminate layer 66 need not necessarily be provided as a three layer system. In some applications, it may be desirable to provide the laminate layer 66 as a 1 layer system or a two layer system. Alternatively still, systems using more than three layers may also be used.

Thus, in yet another embodiment, it should be appreciated that in some applications it may be desirable to provide the first laminate layer (i.e. layer 1) as zirconium (Zr) or as aluminum (Al) and the second laminate layer (i.e. layer 2) as a polymer having an adhesive (or "sticky") characteristic. A suitable polymer is one which is physically and chemically stable during at least the following processes: (1) during the process of attaching the handle to an original substrate or wafer (e.g. original substrate 88 in FIG. 1A); (2) during removal of a support substrate (e.g. substrate 24 in FIG. 1A) from an original substrate or wafer (e.g. original-handle complex 99 in FIG. 1A) to provide a handle-semiconductor complex (e.g. handle-thin film complex 77 in FIG. 2A); (3) during alignment of a substrate surface to a second substrate; (4) during attachment of a handle-semiconductor complex (e.g. handle-thin film complex 77 in FIG. 2A) to a substrate (e.g. substrate 5b in FIG. 3A); and (5) during removal of a laminate layer without destroying or damaging a connection between two substrates (e.g. substrates 5a, 5b in FIG. 3A).

In this case, by using a polymer, the number of layers in the laminate structure 66 has been reduced from three layers to two layers and the laminate structure will still function as intended.

In still another embodiment, it should be appreciated that in some applications it may be desirable to provide the laminate as a polymer having an adhesive (or "sticky") characteristic such that when disposed on a surface of an original wafer (e.g. original wafer 88), this single layer (e.g., laminate structure 66) can attach to both the surface of the original wafer and a surface of the handle member. A suitable polymer is one which is physically and chemically stable during at least the following processes: (1) during the process of attaching the handle member to an original substrate or wafer (e.g. original substrate 88 in FIG. 1A); (2) during removal of a substrate (e.g. substrate 24 in FIG. 1A) from an original substrate or wafer (e.g. original-handle complex 99 in FIG. 1A) to provide a handle-thin film complex (e.g. handle-thin film complex 77 in FIG. 2a); (3) during alignment of a substrate surface to a second substrate; (4) during attachment of a handle-thin film complex (e.g. handle-thin film complex 77 in FIG. 2A) to a substrate (e.g. substrate 5b in FIG. 3A); and (5) which succumbs to chemical or laser attack (e.g. laser ablation) during removal of a laminate layer without destroying or damaging a connection between two semiconductor substrates (e.g. substrates 5a, 5b in FIG. 3A).

In this case, by using a polymer, the number of layers in the laminate structure 66 has been reduced from three layers to one layer and the laminate structure will still function as intended.

In yet another embodiment, one of the layers is a single-layer or multi-layer laminate structure which includes an inorganic dielectric such as silicon oxide.

In view of the above, it should therefore, be appreciated that depending upon on the material(s) selected for use in the laminate structure 66, the lower bound on the number of layers inside the laminate structure is one (i.e. a single layer laminate structure 66) and the upper bound can be as large as desired (or practical) depending upon the desired application and any limitations imposed by available manufacturing techniques.

In the embodiment shown in FIG. 1B, the combination of processing handle member 26 and its own laminate structure 66a (i.e. handle-member laminate 66a) is mounted on the top surface of the original semiconductor substrate 88. In the exemplary embodiment shown in FIG. 1B, the handle-member laminate 66a is attached to the original-semiconductor-laminate structure 66b. It should be appreciated, however, that in some applications, it may be desirable or necessary to attach handle-member laminate 66a directly to the top surface of the semiconductor structure 88 or 5a. It should also be appreciated, however, that in some applications, it may be desirable or necessary to omit the handle-member laminate 66a and instead provide only the original-semiconductor-laminate structure 66b and attach it directly to a surface of the handle member 26

The processing handle member 26 is constructed and arranged to permit a machine or an operator to securely hold the processing handle member 26 while picking, placing or otherwise transporting the handle-thin film complex 77 (FIG. 2A) during the execution of a plurality of processing operations, including but not limited to grinding, etching and/or polishing, for forming a multi-layer semiconductor device structure (such as multi-layer semiconductor device structure 5 described below in conjunction with FIG. 4A).

Depending upon the method of handle substrate release (as will be described below in conjunction with FIG. 4B), the handle substrate 26 might require further modifications prior to disposing the laminate structure 66a onto a surface of the handle 26. For instance, if an ion bombardment-assisted handle release process is used (e.g. when a thin layer on the face of the handle substrate 26 is pre-fractured using ion implantation), then an extra ion implantation step is required prior to oxide/nitride layer 27b deposition.

Disposed on the oxide/or/nitride layer 27b is the handle substrate's laminate structure 66a (noting that the original semiconductor substrate has its own separate laminate structure 66b), which includes a first layer 67a of Zirconium (Zr) or a 1-20 μm (preferably 15-20 μm) of aluminum (Al) and a bilayer 67c of copper (Cu) and tantalum (Ta) 67b. In the exemplary embodiment, the Zr layer can have a thickness ranging from approximately 100 nm to 500 nm, the Cu layer can have a thickness ranging from approximately 250 nm to 350 nm, and the Ta layer can have a thickness ranging from approximately 50 nm to 100 nm. Furthermore, the silicon handle substrate 28 can have a thickness ranging from approximately 500 to approximately 600 μm. Further, the oxide or nitride layers 27a, 27b can have a thickness ranging from approximately 400 to approximately 500 nm.

It should be understood that in accordance with the present invention a number of other materials can be employed for the various layers of the processing handle member 26 and the laminate structures 66a, 66b, as long as the processing handle member 26 can be removed without damaging or weakening any other bonds formed between other components of the multi-layer semiconductor device structure 5 (FIG. 4A). For example, the fused laminate structures 67c, 67c', which attaches or otherwise couples the handle member (could be a different material from silicon) to the original semiconductor structure (also could differ from silicon), can be formed from a number of adhesive materials. It should be appreciated that either or both of the handle member and the original semiconductor structure could be provided from a material which is different from each other and which is different from silicon. It should be noted however, that the number of adhesive materials each include a property that permits them to dissolve or otherwise change state in the presence of a reactant without affecting another adhesive property (e.g. a bond characteristic) formed between a bottom surface 25 (FIGS. 2D, 3A) of the handle-thin film complex and an anchor substrate or wafer such as anchor substrate or wafer 5b shown in FIG. 3A. In one embodiment, the number of adhesive materials employed for securely coupling the processing handle member 26 to the original semiconductor substrate can include at least one of or combination of polymers, inorganic dielectrics such as silicon oxides, or other metals such as Al.

It should also be appreciated that in the embodiment shown in FIG. 1B, the laminate structures 66a, 66b each comprise three layers of materials. In one exemplary embodiment, the layers (in the orders of the sequence of deposition) are provided as: a release layer (e.g. layers 67a, 67a') a metal adhesion/diffusion barrier layer (e.g. layers 67b, 67b') and a fusion layer (e.g. layer 67c or 67c'). The release layer 67a may be provided, for example, from a material that will dissolve and which has a reaction rate to an acid bath step which is higher than the reaction rate of all other materials in the semiconductor structure. The release layer is also provided having a characteristic such that it is chemically and physically stable during several processes including but not limited to: (1) the removal of the substrate from the backside of the original-handle complex to provide the handle-thin film complex (77); (2) the alignment of the backside of the handle-thin film complex (77) to the face of an anchor semiconductor substrate 5b; and (3) the bonding of the anchor semiconductor substrate 5b to the handle-thin film complex face-to-back by means of a bonding medium (e.g. copper fusion layer). The release layer may, for example, be provided from a material such as zirconium or aluminum or other material with suitable characteristics.

The metal adhesion/diffusion barrier layer may be provided for example, from a material which is chemically and physically stable during several processes including but not limited to: (1) the removal of the substrate from its backside (i.e. the backside of the original handle complex 99) to provide the handle-thin film complex (77); (2) the alignment of the backside of the handle-thin film complex (77) to the face of an anchor semiconductor thin film or substrate (5b); (3) the bonding of the handle-thin film complex face-to-back to the anchor semiconductor structure by using a bonding medium; and removal of the handle member without dissolving a bond between the two semiconductor thin-films or substrates (e.g. semiconductor substrates 4a, 5b). The metal adhesion/diffusion barrier layer may, for example, be provided from tantalum or any other material having suitable characteristics. It should be appreciated that to use the laminate to attach an original substrate to a handle member to provide an original-handle complex, the metal in the adhesion/diffusion diffusion barrier layer is largely dependent upon the type of material being used for the attachment (e.g. fusion) layer. In one embodiment, in which copper is used for the fusion layer, tantalum is used for the metal adhesion/diffusion barrier layer because it is compatible with copper.

It should also be appreciated that for the laminate to attach an original wafer to a handle member to provide an original-handle complex (such as original-handle complex 99 shown in FIG. 1A), attachment must take place between the layers 67c, 67c' when the substrates are in contact with each other. Although in the exemplary embodiment described herein, Cu—Cu fusion was used, other material systems and attachment techniques in addition to fusion techniques can also be used (e.g. adherence via sticky polymers or inorganic dielectrics).

In one exemplary embodiment, to initiate the original-handle layer transfer, the processing handle member 26 is face-to-face mounted on the original semiconductor substrate using thermal fusion of the two copper layers 67c, 67c' (contributed from the laminate structures 66a, 66b on the handle member 26 and the original semiconductor substrate 88 respectively) inside a bonding chamber (not shown)

In one embodiment, the bonding chamber is controlled to provide 300-400° C. in $N_2$ ambient during laminate structure fusion. Further, the bonding chamber is controlled to provide persistent contact pressure of approximately 4000 mbar to the processing handle member 26 and to the original semiconductor substrate 88 for approximately 30-60 minutes. In addition, the processing handle member 26 and the original semiconductor substrate 88 can be annealed at approximately 300-400° C. in $N_2$ ambient for approximately 30-60 min., in which the Cu—Cu interface (when the two Cu films came from separate laminate structures) forms a relatively strong bond. It should be understood that the above-described bonding chamber control values and/or attributes are not intended to be limiting, but rather to provide an exemplary set of control values and attributes for the bonding chamber during coupling of the processing handle member 26 and the original semiconductor substrate.

Figure 2A:
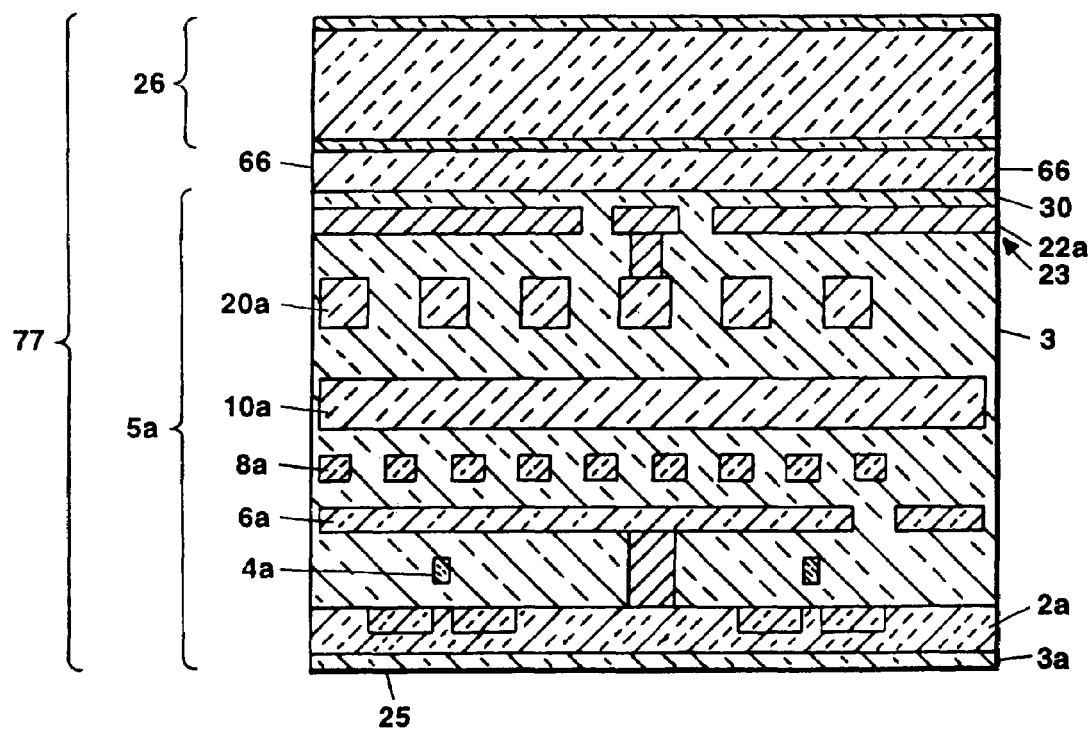
FIG. 2A shows the handle-thin layer complex after the original semiconductor substrate was subjected to a process for removing at least a portion of a substrate from the backside

Referring collectively to FIGS. 1A and 2A, the processing handle member 26 can be used to retain the original semiconductor substrate 88 in position while removing a predetermined amount of bulk substrate 24 from the bottom surface 24a (FIG. 1A) of the original-handle complex 99. It should be understood that many processes known to those of ordinary skill in the art can be used to remove the predetermined amount of the bulk substrate from the bottom surface 24a of the original-handle complex 99, such as aqueous chemical etching, plasma etching, or any other chemical and/or mechanical techniques including but not limited to, lapping or other mechanical grinding techniques, which can be controlled to stop on the buried oxide layer 3a that separates the semiconductor device layer 2a from the substrate 24. In one embodiment, the buried oxide layer that separates the semiconductor device layer 2a from the substrate 24 is approximately 400 nm thick and serves to seal and protect the thin semiconductor device layer 2a.

In the exemplary embodiment of FIG. 1A, the substrate 24 may be provided having a thickness in the range of about approximately 500 μm to approximately 600 μm. In such an embodiment, approximately 400-420 μm of the bulk substrate 24 is removed using a mechanical process (e.g. grinding) and a remaining approximate 80 to 100 μm of the bulk substrate 24 is removed using a chemical process (e.g. an etch solution, which contains approximately 4.38 M (20% wt) KOH at 80° C. for approximately 2 hrs, which has a Si to oxide selectivity of about 800:1).

It should be understood that, at the same KOH concentration, Zr is virtually impervious to a hydroxide attack until the solution temperature reaches beyond 120° C. Furthermore, a 100 nm LPCVD nitride layer previously disposed on the processing handle member 26 provides protection for the processing handle member 26 against KOH attack. Therefore, the bulk substrate 24 of the original semiconductor substrate can be removed, as described above, without affecting the bond (e.g. fusion of the laminate layers 66a, 66b) formed between the processing handle member 26 and original semiconductor substrate 88. Since the semiconductor thin film is now only in contact with the handle substrate, this completes the original-to-handle layer transfer phase of the multi-layer or three-dimensional (3-D) process.

It should be appreciated that to remove a substrate (e.g. substrate 24 in FIG. 1A) from an original substrate or wafer (e.g. original-handle complex 99 in FIG. 1A) to provide a handle-thin film complex (e.g. handle-thin film complex 77), it is not necessary to remove all of the semiconductor substrate 24 from the backside of the original-handle complex 99. In one embodiment a two-step process is used. The two step process includes: (A) partial removal of the semiconductor substrate 24 from the backside of the original-handle complex 99 using a rough mechanical grindback; and (B) residual removal of the semiconductor substrate 24 from the backside of the original-handle complex 99. The partial removal process (i.e. step (A)) can be accomplished using any mechanical grindback technique well-known to those of ordinary skill in the art. The residual removal process (i.e. step (B)) may be performed using a variety of techniques including but not limited to (1) aqueous chemical etch accomplished via heated KOH (potassium hydroxide) or TMAH (tetramethylammonium hydroxide) solutions; or (2) vapor chemical etch accomplished via with $XeF_2$ (xenon difluoride) gas, or (3) plasma etch accomplished via a number of gasses such as $SF_6$ (sulfur hexaflouride), $Cl_2$ (chlorine), HBr (hydrogen bromide), etc. that etches silicon. For other kinds of substrate materials, other gasses apply.

While it is recognized that it may also be possible to remove the substrate to provide a handle-thin film complex using a one step aqueous chemical etch, a two-step process is believed to be faster and more efficient.

Figure 2B:
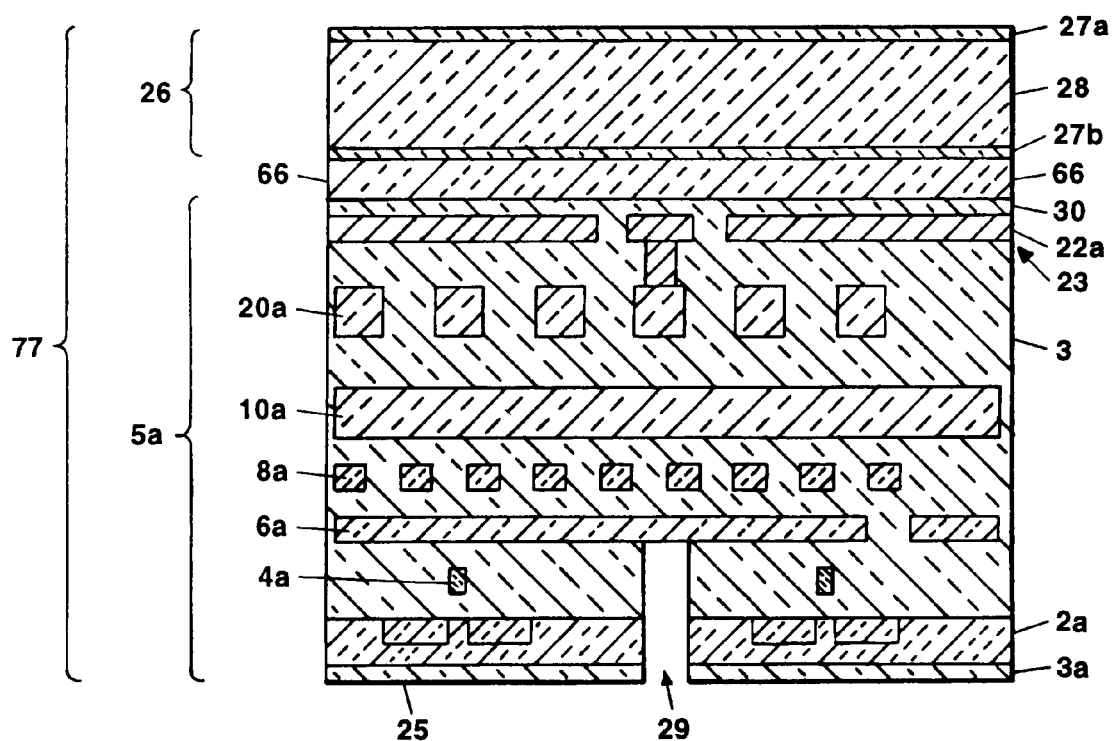
FIG. 2B shows the handle-thin layer complex after being subjected to a process for forming a via-hole on the bottom surface of the structure.

Referring now to FIG. 2B, after removing the substrate portion 24, as described above, at least one via-hole can be formed on the bottom surface 25 of handle-thin film complex 77. The via-hole can be formed using a conventional technique such as plasma etching process, which can be controlled to stop at interconnect layer 6a. In the exemplary embodiment, the via-hole 29 is provided having an aspect ratio of approximately 2:1 and a via-hole width of approximately 0.5 µm.

Figure 2C:
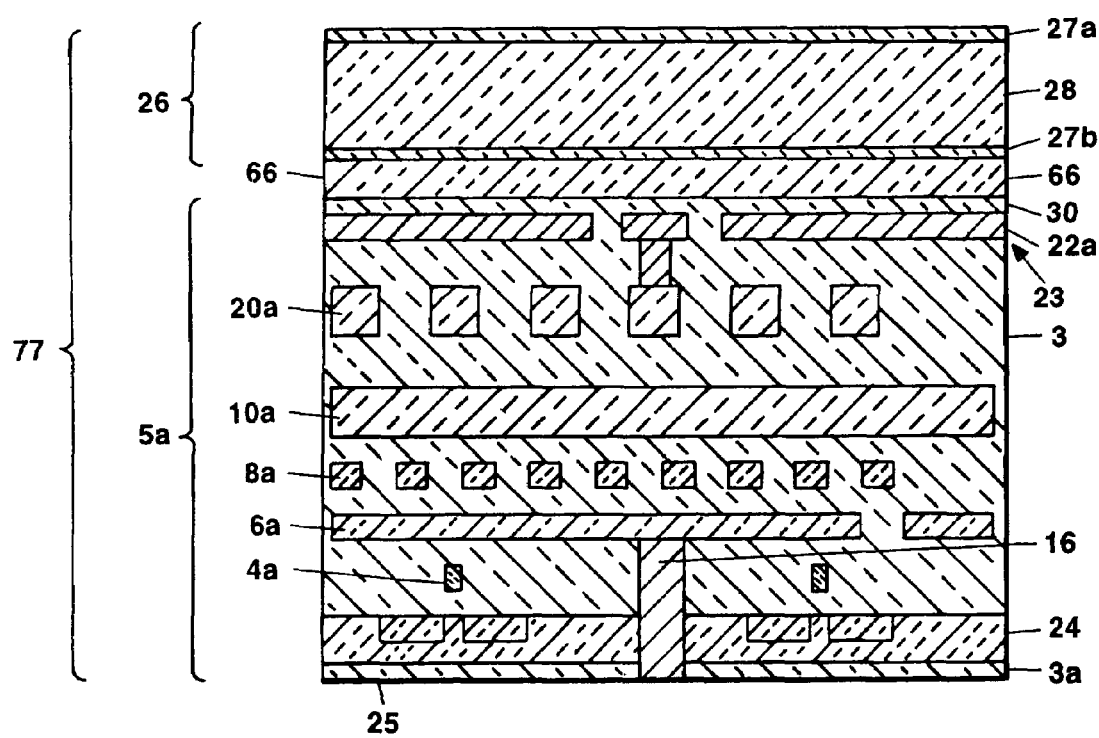
FIG. 2C shows the handle-thin layer complex after being subjected to a process for filling the via-hole on the bottom surface of the structure with a conductive material.

As shown in FIG. 2C, the etching process for forming the via-hole 29 (FIG. 2B) is followed by a PECVD oxide via-hole sidewall passivation process and a damascene process for filling the via-hole 29 with a conductive material or conductive plug having one end coupled to the interconnect layer 6a and the other end exposed from the via-hole at the bottom surface 25 of the handle-thin film complex 77. In the exemplary embodiment, the via-hole 29 can be filled with tungsten to form a tungsten plug. Other conducting materials such as copper and aluminum could also be used.

Figure 2D:
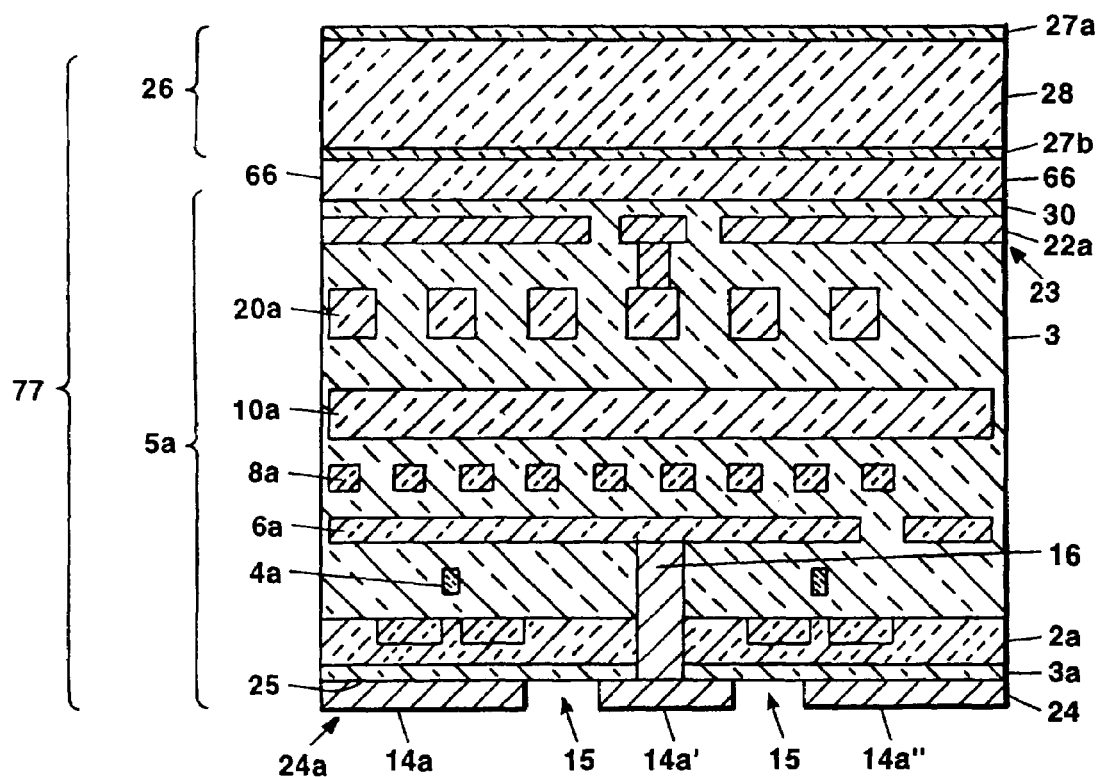
FIG. 2D shows the handle-thin layer complex being subjected to a process for disposing an interface portion (handle-anchor bond material) on the bottom surface of the structure.

As further shown in FIG. 2D, an interface portion 14a, which is similarly constructed and arranged as the first interface portion 22a, can be formed on the bottom surface 25 of the handle-thin-film complex 77. In embodiments in which layer 3a is omitted, the surface 25 may correspond to a suitably prepared surface of layer 2a. The interface portion 14a serves to provide an interface to the anchor substrate 5b, which will be described in further detail below in connection with FIG. 3A.

The interface portion 14a includes a portion 14a' disposed over and in electrical communication with the second end of the conductive plug 16 and a second portion 14a" disposed over adjacent portions of the bottom surface 25' of the handle-thin film complex 77. In the exemplary embodiment, the interface portion 14a includes a Ta layer at 50 nm and a Cu layer of 300 nm thick. Further, the lateral dimensions of the first portion 14a' of the second interface portion 14a can range from approximately 1 to 5 µm.

Figure 3A:
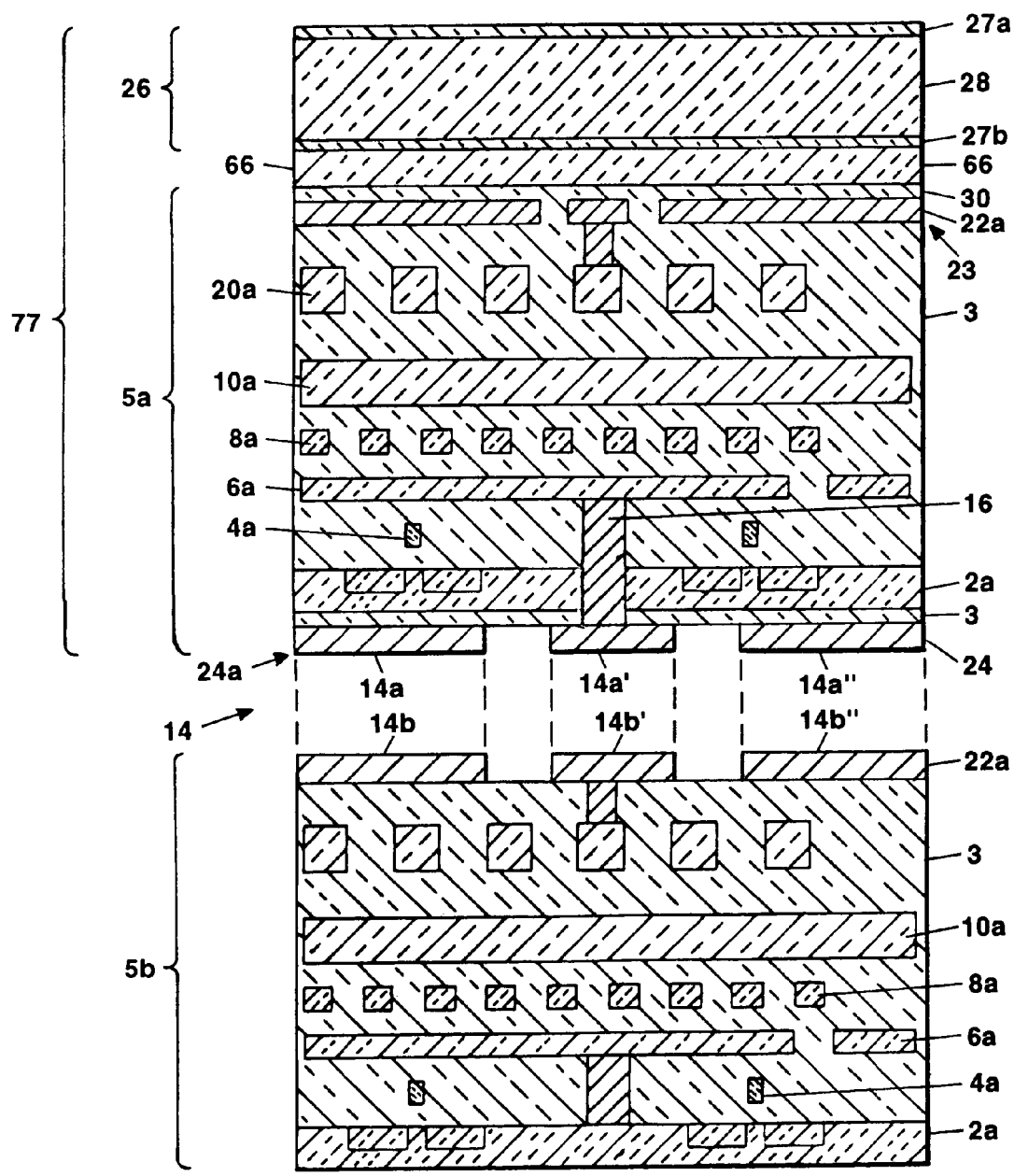
FIGS. 3A and 3B show the handle-thin layer complex being aligned with the anchor substrate, which already contains semiconductor devices on its face, in order to execute a process for the handle-anchor bonding step.
Figure 3B:
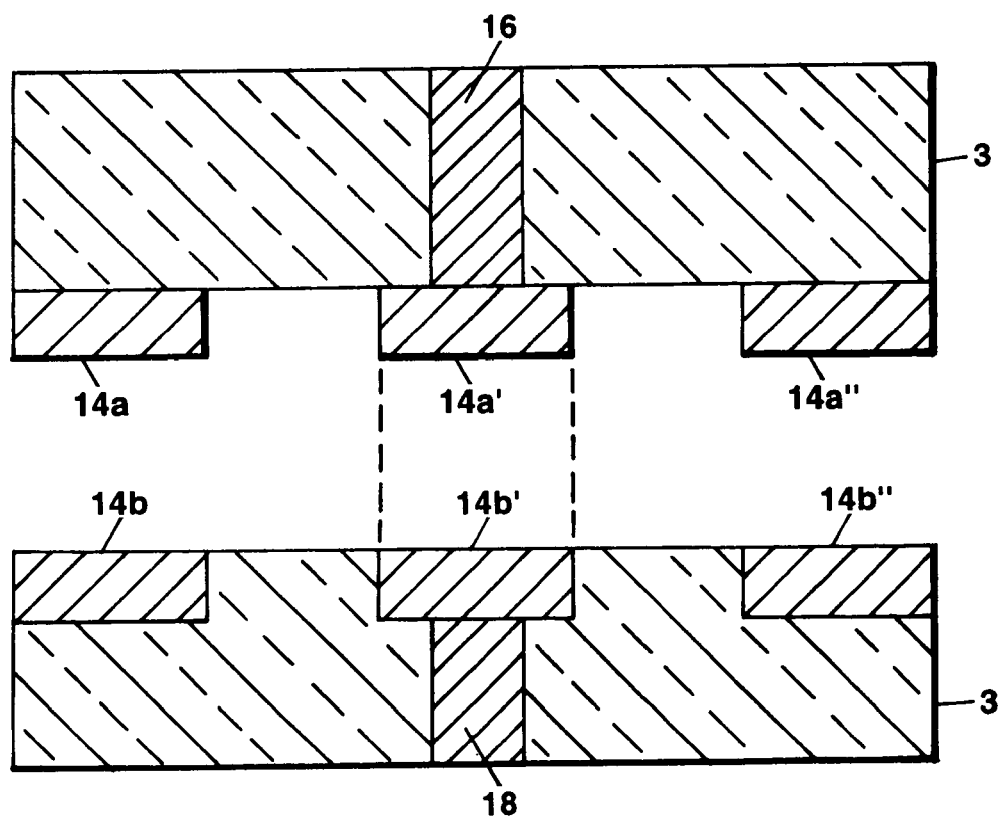
Figure 4A:
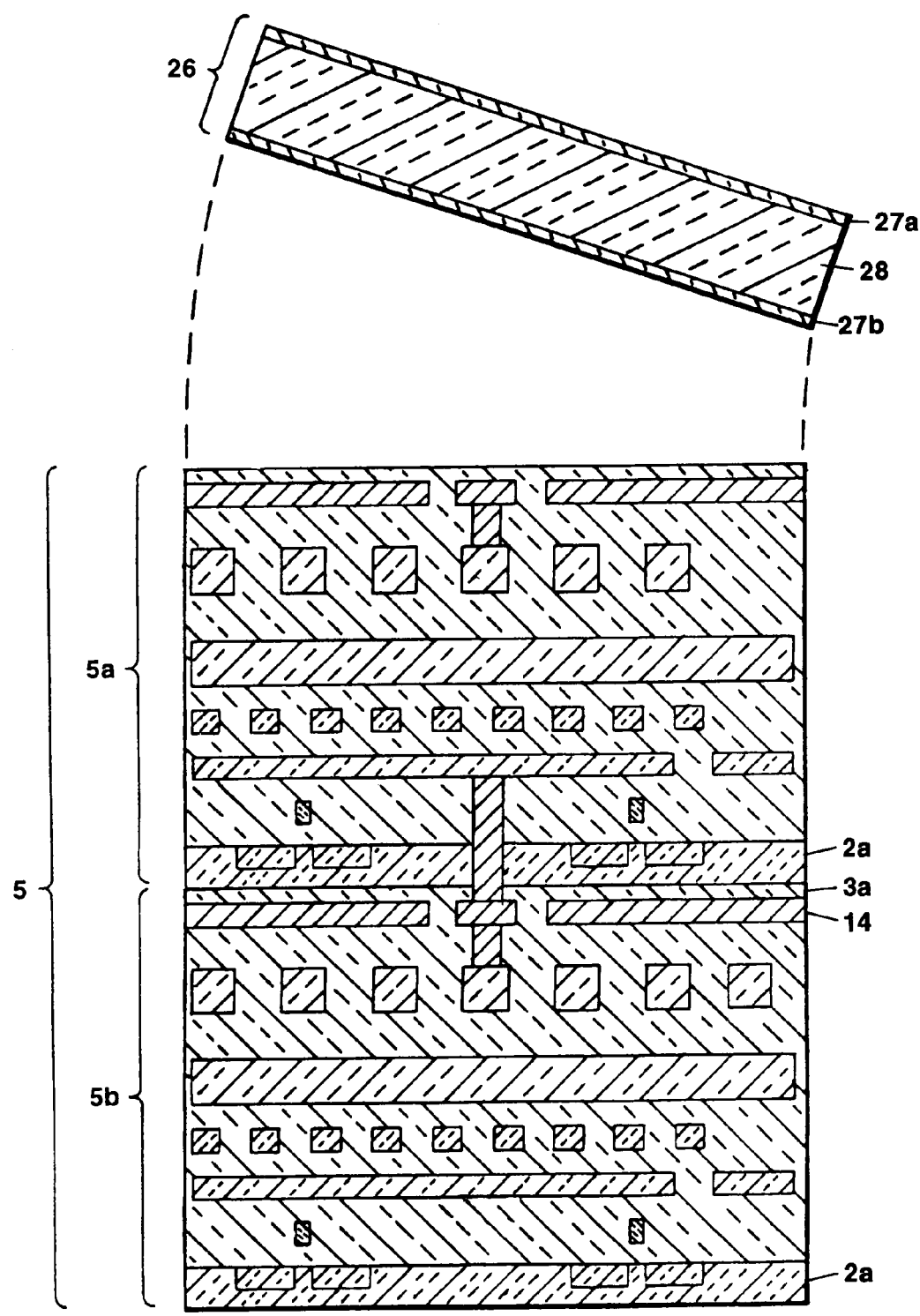
FIGS. 4A and 4B, show the processing handle member being removed from the bonded complex, which forms the multi-layer semiconductor device structure.

In the exemplary embodiment, the portion 14a' of the interface portion 14a provides an electrical communication interface between at least the interconnect layer 6a of the semiconductor devices on the thin film 5a and one or more elements located on the anchor substrate 5b (FIG. 3A) to form the multi-layer semiconductor device structure 5 (FIG. 3A). Furthermore, the portion 14a" of the interface portion 14a provides a bonding interface for coupling the handle-thin film complex 77 and the anchor substrate 5b.

In the exemplary embodiment described herein, the bonding medium between the handle-thin film complex 77 and the anchor substrate 5b is copper. A copper bonding medium was selected for a variety of reasons including but not limited to the fact that copper can act as the bonding medium (e.g. as shown in structures 14a and 14a" in FIG. 2D) and copper can also act as the inter-wafer electrical connection (e.g. as shown in structure 14a' in FIG. 2D).

It should, however, be appreciated that, the bonding medium could be provided from a material other than copper such as polymers, inorganic dielectrics, or conductive materials other than copper as long as the bond provided by the material can withstand the process for removing the laminate layer. For example, if the laminate layer is removed via a chemical process, then any exposed bonding medium material must be able to withstand the chemical environment involved in the laminate removal process. It should also be appreciated that if the bond medium includes polymers (electrical insulators) and/or inorganic dielectrics, then a different metal contact material and associated technique may be required to provide the electrically conductive contact 14a'.

Again, noting that since the structures 14a and 14a" do not participate in any critical electrical connection, pathways, it should be understood that contacts 14a and 14" can actually be a material that differs from the material which provides contact 14a'. For example, contacts 14a, 14a" maybe provided from sticky polymer bonding pads for mechanical purposes only and contact 14a may be provided from copper for electrical connectivity.

As shown in FIG. 2D, one can see that the seams 15 (e.g. corresponding to voids or air) exist between contacts 14a, 14a' and 14a". Instead of voids, these small seams 15 can actually contain sticky polymers that aid in bonding, or it can also be oxide, nitride, or any other back-end compatible dielectrics. The ramifications of such use are relatively significant. For example, if contacts 14a, 14a', and 14a" are provided from copper and a sticky polymer is disposed in the seams 15, then the primary mechanical bonding pads may correspond to polymer-polymer pads at seems 15 rather than copper-copper pads at contact 14a, 14a' and 14a".

Referring now to FIG. 3A, one can initiate the handle-to-anchor layer transfer step by using the handle-thin film complex 77 to pick and align the thin film 5a onto the anchor wafer 5b, which is similarly constructed and arranged as the original semiconductor substrate 88. More specifically and with further respect to FIG. 3B, the interface portion 14a defined on the backside of the handle-thin film complex 77 can be substantially aligned with a mirror-image interface portion 14b defined on the anchor wafer 5b. In the exemplary embodiment, the process of aligning the interface portions 14a, 14b respectively defined on the handle-thin film complex and the anchor semiconductor substrate (77 and 5b. respectively) can be performed using an Electronic Vision EV 450 Aligner. After alignment, the interface portions 14a, 14b, respectively defined on both the handle-thin film complex and the anchor semiconductor substrate (77 and 5b, respectively) can be bonded together to form a multi-layer semiconductor device structure 5.

In an exemplary embodiment, bonding the handle-thin film complex to the anchor semiconductor substrate (77 and 5b, respectively) for forming the multi-layer semiconductor device structure 5 includes mounting both substrates face-to-face on a fixture (not shown) and clamping the entire structure together using the fixture. Thereafter, the fixture is transferred to the bonding chamber, where the entire complex is heated to approximately 400° C. in $N_2$ ambient and hot-pressed for approximately 30 minutes under about 4000 mbar of pressure. Further, the entire complex is annealed at 400° C. for approximately 30 minutes in $N_2$, which completes the bond of the interface portion 14a defined on the backside of the handle-thin film complex 77 to the interface portion 14b defined on the anchor semiconductor substrate 5b.

Referring to FIG. 4A, bonding the interface portions 14a, 14b, together, as described above, forms a single or unitary bonding interface between the handle-thin film complex and the anchor semiconductor substrate (77 and 5b). Thus, the bonded interface portions 14a, 14b, as previously shown in FIG. 3A, are hereinafter redefined as a unitary "interface portion 14," as now shown in FIG. 4A.

After bonding the first and second semiconductor device structures 5a, 5b together to form the multi-layer semiconductor structure 5, the processing handle member 26 can be removed or released from the top surface of the thin film 5a, thereby completing the handle-to-anchor layer transfer portion of the 3-D process. As described in the exemplary embodiment above, the processing handle member 26 is attached to a doubly-fused Zr/Cu—Cu/Zr laminate, which can be destroyed by immersing the multi-layer semiconductor structure 5 including the processing handle member 26 in a delaminating solution. In an embodiment, the delaminating solution includes a dilute 10:1 water:HF (hydrogen fluoride) solution, for which the Zr portions of the processing handle member 26 succumbs to HF attack at an extremely high rate, which is much higher than the rate of $SiO_2$ degradation.

Figure 4B:
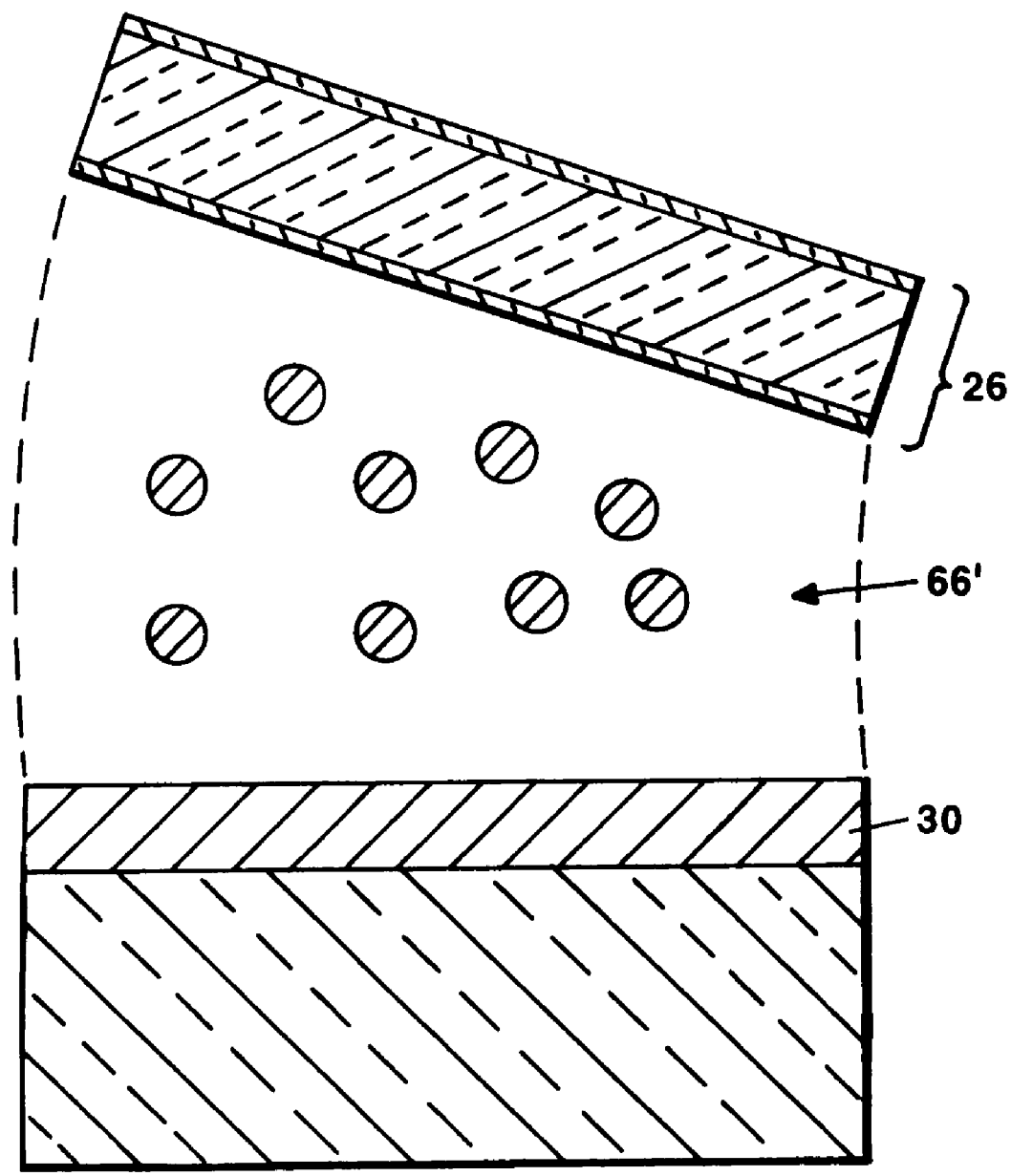

Therefore, with vigorous agitation of the multi-layer semiconductor structure 5 in the delaminating solution, the Zr portions of the laminate structure 66 (e.g. portions of laminate structures 66a/66b in FIG. 1B) will be subjected to relatively rapid undercutting, which extends laterally through all Zr portions of the laminate structures, as shown in FIG. 4B. Reference number 66' in FIG. 4B indicates that at least portions of the laminate 66 are breaking down. The breakdown of the Zr portions of the laminate structure 66a/66b permits the processing handle member 26 to be removed.

After the processing handle member 26 is removed from the multi-layer semiconductor device structure 5, the multi-layer semiconductor structure 5 can be dipped in dilute HF, which cleans and further exposes the interface portion 22a, which was described above in connection with FIG. 1A.

It should be understood that the multi-layer semiconductor device structure 5 is infinitely scaleable in that an infinite number of additional semiconductor device structures (not shown) can be coupled to the multi-layer semiconductor device structure 5 by redefining the multi-layer semiconductor device structure 5 as a semiconductor device structure, which is similar to the anchor substrate 5b of FIG. 3A. Thereafter, the above described process can be repeated for coupling another semiconductor device structure (not shown) to the most recently defined "original" semiconductor substrate.

Although not specifically shown, it should be readily understood that the anchor-thin film complex (5a and 5b) of the multi-layer semiconductor device structure 5 can each be respectively redefined as a new anchor substrate 5b. In this arrangement, a number of wafers can be stacked to form a multi-layer semiconductor wafer structure. The multi-layer semiconductor wafer structure can be sliced to form a plurality of multi-layer semiconductor die structures.

Furthermore, although not specifically shown, it should also be understood that the anchor-thin film complex (5a and 5b) of the multi-layer semiconductor structure 5 can each be respectively redefined as a new anchor die, which form a multi-layer semiconductor die structure 5. Further, yields can be improved by testing each individual die structure (e.g. the first and second die structures 5a, 5b) prior to bonding to ensure that only known good dies (KGD) are bonded together.

It should be understood that although the exemplary system described herein refers to a laminate structure having three layers, more or fewer than three layers can be used to provide the laminate structure. It should also be appreciated that it is possible to interchange the position of the first and second layers (i.e. the release and diffusion layers). Such an interchanging of layers results in a laminate structure 66a, 66b which still operates properly. This is because the third layer (i.e. the fusion layer) will still fuse when layers 67c, 67c' are in contact and the release layer will dissolve when the laminate layer 66b is removed without damaging any bonds between thin-film materials.

Having thus described at least one illustrative embodiment of the invention, various alterations, modifications and improvements will readily occur to those skilled in the art. Such alterations, modifications and improvements are intended to be within the scope and spirit of the invention.

For example, as described above, the doubly-fused laminate structure provided from laminate portions 66a, 66b in the handle—thin film—anchor complex can be destroyed by dipping the entire structure inside a pre-determined bath (e.g. an acid bath). Since the release layers of the laminate structures 66a, 66b will react very rapidly with the bath compared to the rest of the structure, they will dissolve soon before any other portion of the structure is changed by the bath. Once the release layers dissolve, the handle member 26 and the final multi-layer semiconductor device structure 5 (FIG. 4A) will separate.

It should be appreciated, however, that while several techniques for removing the handle member have been described herein, such techniques should be considered as exemplary and are not intended to be limiting. It should thus be appreciated that all techniques, now known or later discovered for removing a handle member should be encompassed by the scope of the claims. Such methods include but are not limited to: (a) aqueous-activated methods utilizing 10:1 HF for Zr and a combination of acids and surfactants for A aluminum; (b) vapor-activated methods (such as using corrosive gases to dissolve a pre-determined layer inside the laminate); (c) light-activated methods (e.g. laser ablation of a polymeric laminate); (d) temperature-activated methods (freezing, heating, etc.); (e) ion bombardment-activated methods (e.g. pre-fracturing the handle member by ion implantation prior to bonding the original semiconductor substrate to the handle member); (f) electrically-assisted methods (i.e. high-voltage breakdown of a laminate); and (g) purely mechanical handle member separation methods (e.g. die-sawing, prying, etc. . . . ) of the handle member, and with/or without any other aforementioned assisted techniques. All of the above materials and techniques are collectively referred to herein as release agents. It should be understood that the particular types of gasses, chemicals, light characteristics, temperature characteristics etc. that are used as release agents will, of course be dependent upon the particular materials in the laminate structure 66 to be destroyed. That is, the laminate will be provided having a reaction rate to the particular release agent being used which is greater than the reaction rate of the bond used to provide the multi-layer semiconductor structure to the same release agent.

When the laminate or handle includes a release layer provided from aluminum (e.g. when layers 67c, 67c' are provided from aluminum), then effective handle-member release is achieved by having the releasing reagent (e.g. the acids) encroach the original-handle complex bonding layer, thereby dissolving the release layer (e.g. a relatively think layer of Al). The main roadblock here is that liquid penetration using only acids and water is small due to high surface tension between the metal-acid interface. To alleviate this: (a) the release layer is made thicker in order to provide a relatively wide "channel" for the acid to go through; (b) surfactants are used to reduce the liquid surface tension; (c) ultrasound is used to remove "debris" (i.e. un-dissolved Cu/Ta that lies on top of the Al) out of the original-handle complex bond. Thus, the release layer should be provided having a thickness of at least about 10 um (to facilitates 1.5 cm edge encroachment) and the release layer should be provided from an amphoteric solid material that dissolves outside of 4<pH<10 (e.g. Al).

In this example, the releasing reagent may be provided as a mixture of non-oxidizing strong acids (i.e. high protonation for quicker Al dissolution) and surfactants as follows (all concentrations in M=mol/L):

a) 3.8 M phosphoric acid (H3P04);
b) 3.0 M hydrocholoric acid (HC1);
c) 0.05 M nonylphenol ethoxylate (NPE), 12 mol moiety;
d) main solvent=water 12 mol=12 ethoxylate groups attached to the aromatic ring;
e) Heating: 90 C, constant stirring; and
f) ultrasound needed One way to present the composition is: one part NPE (12), 6 parts HCl, 6 parts H3P04, and 6 parts water with each of the above being by volume assuming that all chemicals are of normal and maximum concentration (98% by weight for NPE (12)).

Another way to present the composition is: 1.66 part water, one part phosphoric, one part hydrochloric; and one part NPE (12).

Similarly, it should be appreciated that while several laminate structures are described herein, such laminate structures should be considered as exemplary and are not intended to be limiting. It should also be appreciated that laminate structures which have one or more layers, or which are completely buried between two solid substrates (e.g. as described above) or which are partially exposed laminate structures may also be used. "Partially exposed" laminate structures refer to laminate structures having a void or hole provided therein which begins on one surface of a handle member (e.g. a top or exposed surface of handle member 26 in FIG. 1A) that goes down through the handle member 26 and accesses a laminate structure (e.g. laminate structure 66 in FIG. 1A or layer 67a of laminate structure 66 in FIG. 1B). Accordingly, it is believed that other laminate structures now known or later discovered should also be encompassed by the scope of the claims as applied to three-dimensional integrated circuit fabrication It is also understood that the selection of laminate materials must be considered when selecting processing methods (e.g. attachment and release methods) and vice-versa. For example, it is understood that in a system which utilizes a release layer provided from Ta (rather than from Al as mentioned in the example above), then HCl must be used as the release agent.

It should also be appreciated that the techniques described hereinabove can be utilized in a three-dimensional die-die level process to provide a three-dimensional die-die level structure. This means, for example, that the original semiconductor substrate 88 (FIG. 1A), the handle member 26 (FIG. 1A) and the anchor substrate 5b (e.g. as shown in FIG. 4A) would switch from the wafer level to the die level during the process described above. Thus, the techniques described hereinabove can be used in die-die, wafer-to-wafer, and die-to-wafer three-dimensional processes to provide die-die, wafer-to-wafer, and die-to-wafer three-dimensional structures.

Accordingly, the foregoing description is by way of example only and is not intended as limiting. The invention's limit is defined only in the following claims and the equivalents thereto. All references and publications cited herein are expressly incorporated herein by reference in their entirety.

What is claimed is:

1. A method of providing a multi-layer semiconductor structure, the method comprising:
   providing a first semiconductor structure having first and second opposing surfaces; and
   disposing a laminate layer over a first one of the first and second opposing surfaces of the first semiconductor structure to provide a first semiconductor structure having a laminate layer disposed thereon wherein disposing a laminate layer comprises providing a layer corresponding to a release layer and providing a layer corresponding to a fusion layer;
   disposing a handle member over the laminate layer.

2. The method of claim 1 further comprising:
   a substrate disposed over a second one of the first and second opposing surfaces of the first semiconductor structure.

3. The method of claim 2 further comprising:
   removing at least a portion of the substrate from the second one of the first and second opposing surfaces of the first semiconductor structure to provide a semiconductor-handle complex.

4. The method of claim 3 further comprising:
   providing a second semiconductor structure; and
   aligning a first surface of the semiconductor-handle complex with a first surface of the second semiconductor structure.

5. The method of claim 4 further comprising:
   bonding the first surface of the second semiconductor structure to the first surface of the semiconductor-handle complex.

6. The method of claim 5 further comprising:
   removing the handle member and the laminate layer.

7. The method of claim 1 wherein providing a first semiconductor structure having first and second opposing surfaces comprises:
   a substrate having first and second opposing surfaces; and
   a first semiconductor structure over a first one of the first and second surfaces of the substrate.

8. The method of claim 1 wherein disposing a handle member over the laminate layer comprises disposing a handle member over the laminate layer such that a surface of the laminate adheres to a surface of the handle member.

9. The method of claim 1 wherein disposing the laminate layer over a first one of the first and second opposing surfaces of the first semiconductor structure to provide a semiconductor structure having a laminate layer disposed thereon further comprises providing a layer corresponding to a metal adhesion/diffusion barrier layer.

10. The method of claim 9 wherein providing a laminate layer comprises:
    providing a first layer corresponding to a release layer;
    providing a second layer corresponding to a metal adhesion/diffusion barrier layer; and
    providing a third layer corresponding to a fusion layer.

11. The method of claim 10 wherein the release layer comprises at least one of zirconium and aluminum.

12. The method of claim 10 wherein the metal adhesion/diffusion barrier layer comprises tantalum.

13. The method of claim 10 wherein the fusion layer comprises at least one of copper; a polymer; and an inorganic dielectric.

14. The method of claim 9 wherein providing a laminate layer comprised of a plurality of layers comprises:
    providing a first layer corresponding to a metal adhesion/diffusion barrier layer;

providing a second layer corresponding to a release layer; and providing a third layer corresponding to a fusion layer.

15. The method of claim 14 wherein the release layer comprises at least one of zirconium and aluminum.

16. The method of claim 14 wherein the metal adhesion/diffusion barrier layer comprises tantalum.

17. The method of claim 14 wherein the fusion layer comprises at least one of copper; a polymer; and an inorganic dielectric.

18. The method of claim 3 wherein removing the substrate from the second one of the first and second opposing surfaces of the semiconductor structure to provide a semiconductor-handle complex comprises removing a portion of the second surface of the semiconductor-handle complex using at least one of: a mechanical grindback, an aqueous chemical etch; a vapor chemical etch; and a plasma etch.

19. The method of claim 5 wherein bonding the first surface of the second semiconductor structure to the first surface of the semiconductor-handle complex comprises providing bonding pads on at least one of the first surface of the second semiconductor structure; and the first surface of the semiconductor-handle complex.

20. The method of claim 19 wherein the bonding pads are provided from at least one of: copper; a polymer; and an inorganic dielectric.

21. The method of claim 6 wherein removing the handle member and the laminate layer comprises using at least one of:

an aqueous-activated method;

a vapor-activated method;

a light-activated method;

a temperature-activated method;

an ion bombardment-activated method;

an electrically-assisted method; and a mechanical method.

22. The method of claim 1 wherein the semiconductor structure corresponds to a die-to-wafer semiconductor structure.

23. The method of claim 1 wherein:

providing a first semiconductor structure having first and second opposing surfaces comprises providing a first semiconductor structure having a face surface and a backside surface; and disposing a laminate layer comprises disposing a laminate layer over the face of the first semiconductor structure to provide a semiconductor structure having a laminate layer disposed thereon.

24. The method of claim 4 wherein:

providing a second semiconductor structure comprises providing a second semiconductor structure; and aligning a first surface of the semiconductor-handle complex with a first surface of the second semiconductor structure comprises aligning the backside of the semiconductor-handle complex with a face of the second semiconductor structure.

25. The method of claim 1 wherein:

the first semiconductor structure corresponds to an original semiconductor substrate;

the first semiconductor-handle complex having a substrate portion corresponds to an original-handle complex having a substrate portion; and the second semiconductor structure corresponds to a second substrate.

26. The method of claim 25 wherein:

the original semiconductor substrate corresponds to a first substrate and the second substrate corresponds to a second substrate.

27. A multi-layer semiconductor structure comprising:

a first semiconductor structure having first and second opposing surfaces; and a laminate layer over one of the first and second opposing surfaces of the first semiconductor structure to provide a first semiconductor structure having a laminate layer disposed thereon wherein said laminate layer includes:

a release layer, and a fusion layer.

28. The structure of claim 27 further comprising a handle member disposed over the laminate layer.

29. The structure of claim 27 further comprising a substrate disposed on a second one of the first and second opposing surfaces of the first semiconductor structure.

30. The structure of claim 27 wherein the first semiconductor structure comprises a plurality of thin film semiconductor layers.

31. The structure of claim 28 further comprising a film layer disposed over at least one surface of the handle member.

32. The structure of claim 31 wherein the film layer is provided from one of: silicon nitride; and silicon dioxide.

33. The structure of claim 28 further comprising a laminate disposed over a surface of the handle member.

34. The structure of claim 27 wherein said laminate layer further comprises a metal adhesion/diffusion barrier layer.

35. The structure of claim 34 wherein:

said release layer corresponds to a first layer of said laminate layer;

said metal adhesion/diffusion barrier layer corresponds to a second layer of the laminate layer; and said fusion layer corresponds to a third layer of the laminate layer.

36. The structure of claim 35 wherein the release layer comprises at least one of zirconium and aluminum.

37. The structure of claim 36 wherein the metal adhesion/diffusion barrier layer comprises tantalum.

38. The structure of claim 37 wherein the fusion layer comprises at least one of copper; a polymer; and an inorganic dielectric.

39. The structure of claim 34 wherein:

said metal adhesion/diffusion barrier layer corresponds to a first layer of the laminate layer;

said release layer corresponds to a second layer of said laminate layer; and said fusion layer corresponds to a third layer of the laminate layer.

40. The structure of claim 39 wherein the release layer comprises at least of one of zirconium and aluminum.

41. The structure of claim 40 wherein the metal adhesion/diffusion barrier layer comprises tantalum.

42. The structure of claim 41 wherein the fusion layer comprises at least one of copper; a polymer; and an inorganic dielectric.

43. The structure of claim 27 wherein the semiconductor structure corresponds to a die-to-wafer semiconductor structure.

44. The structure of claim 28 wherein a portion of the substrate from the second one of the first and second opposing surfaces of the first semiconductor structure and the handle member provide a semiconductor-handle complex and wherein the structure further comprises:

a second semiconductor structure corresponding to a second semiconductor structure disposed over a first surface of the semiconductor-handle complex with a first surface of the second semiconductor structure aligned with a backside of the semiconductor-handle complex.

45. The structure of claim 44 wherein:

the first semiconductor structure corresponds to an original semiconductor substrate;

the first semiconductor-handle complex having a substrate portion corresponds to an original-handle complex having a substrate portion; and the second semiconductor structure corresponds to a second substrate.

* * * * *

UNITED STATES PATENT AND TRADEMARK OFFICE
CERTIFICATE OF CORRECTION

PATENT NO. : 7,307,003 B2
APPLICATION NO. : 10/749103
DATED : December 11, 2007
INVENTOR(S) : Reif et al.

It is certified that error appears in the above-identified patent and that said Letters Patent is hereby corrected as shown below:

Col. 3, line 25, delete "backside" and replace with -- backside; --.

Col. 3, line 66, delete "herein below," and replace with -- hereinbelow, --.

Col. 4, line 41, delete "FIG. 1A the" and replace with -- FIG. 1A, the --.

Col. 5, line 9, delete "layers 2a" and replace with -- layer 2a --.

Col. 6, line 24, delete "1 μm)" and replace with -- 1 μm, --.

Col. 6, line 33, delete "from as Zirconium" and replace with -- from Zirconium --.

Col. 6, line 40, delete "from as Zirconium" and replace with -- from Zirconium --.

Col. 6, line 49, delete "1" and replace with -- one --.

Col. 7, line 39, delete "upon on the" and replace with -- upon the --.

Col. 9, line 29, delete "adhesion/diffusion diffusion barrier" and replace with -- adhesion/diffusion barrier --.

Col. 9, line 52, delete "(not shown)" and replace with -- (not shown). --.

Col. 10, line 52, delete "embodiment a" and replace with -- embodiment, a --.

Col. 11, line 11, delete "as plasma" and replace with -- as a plasma --.

Col. 12, line 9-10, delete "connection, pathways," and replace with -- connection pathways, --.

Col. 12, line 13, delete "maybe" and replace with -- may be --.

Col. 12, line 25, delete "seems" and replace with -- seams --.

Col. 12, line 26, delete "contact" and replace with -- contacts --.

Col. 13, line 39, delete "above described" and replace with -- above-described --.

UNITED STATES PATENT AND TRADEMARK OFFICE
CERTIFICATE OF CORRECTION

PATENT NO. : 7,307,003 B2
APPLICATION NO. : 10/749103
DATED : December 11, 2007
INVENTOR(S) : Reif et al.

It is certified that error appears in the above-identified patent and that said Letters Patent is hereby corrected as shown below:

Col. 13, line 54, delete "form" and replace with -- forms --.

Col. 14, line 45, delete "characteristics etc." and replace with -- characteristics, etc. --.

Col. 15, line 2, delete "facilitates" and replace with -- facilitate --.

Col. 20, line 2, delete "corresponds" and replace with -- correspond --.

Signed and Sealed this

Fifth Day of May, 2009

JOHN DOLL
*Acting Director of the United States Patent and Trademark Office*